United States Patent [19]

Furukawa et al.

[11] Patent Number: 5,433,167
[45] Date of Patent: Jul. 18, 1995

[54] METHOD OF PRODUCING SILICON-CARBIDE SINGLE CRYSTALS BY SUBLIMATION RECRYSTALLIZATION PROCESS USING A SEED CRYSTAL

[75] Inventors: Katsuki Furukawa, Sakai; Yoshimitsu Tajima; Akira Suzuki, both of Nara, all of Japan

[73] Assignee: Sharp Kabushiki Kaisha, Osaka, Japan

[21] Appl. No.: 156,472

[22] Filed: Nov. 23, 1993

[30] Foreign Application Priority Data

Feb. 4, 1992 [JP] Japan .................. 4-19235
Nov. 24, 1992 [JP] Japan .................. 4-313212

[51] Int. Cl.⁶ .................................. C30B 29/36
[52] U.S. Cl. ........................... 117/84; 117/88; 117/105; 117/951
[58] Field of Search ............. 117/84, 88, 105, 951; 437/100

[56] References Cited

U.S. PATENT DOCUMENTS

| | | | |
|---|---|---|---|
| 4,897,149 | 1/1990 | Suzuki et al. | 117/951 |
| 4,981,665 | 1/1991 | Boeker et al. | 117/951 |
| 5,037,502 | 8/1991 | Suzuki et al. | 117/951 |
| 5,288,365 | 2/1994 | Furukawa et al. | 437/100 |

FOREIGN PATENT DOCUMENTS

| | | |
|---|---|---|
| 58-121690 | 7/1983 | Japan . |
| 63-50399 | 3/1988 | Japan . |
| 4120096 | 1/1992 | Japan . |
| 4-193799 | 7/1992 | Japan . |

OTHER PUBLICATIONS

Y. Tairov et al., *Journal of Crystal Growth*, 52:146–150 (1981).

*Primary Examiner*—R. Bruce Breneman
*Assistant Examiner*—Felisa Garrett
*Attorney, Agent, or Firm*—David G. Conlin; Peter F. Corless

[57] ABSTRACT

There is provided a method of producing a high-quality n-type, 6H silicon carbide single crystal with good reproducibility. A silicon carbide single crystal substrate having a growth orientation of <0001>, as a seed crystal, is mounted to an inner surface of a cover of a graphite crucible. A source material includes a high-purity silicon carbide powder having an impurity proportion of not more than 1 ppm and an aluminum powder of 50 ppm relative to the silicon carbide powder. The source material is loaded into the graphite crucible. The graphite crucible is closed with a seed crystal-mounted cover placed in a double quartz tube. Ar gas and $N_2$ gas are caused to flow in the double quartz tube. Temperature of the silicon carbide powder and aluminum powder is controlled to 2300° C., and temperature of the silicon carbide single crystal substrate to 2200° C.; and interior of the double quartz tube is controlled to 30 torr. Silicon carbide single crystal growth is effected on the seed crystal under these conditions. A high-quality n-type, 6H silicon carbide single crystal is thus obtained which has a uniform crystal structure with little defect, if any, throughout its structure, from the substrate surface to the outermost grown surface, and has a specific resistance of 0.5 Ωcm.

7 Claims, 2 Drawing Sheets

METHOD OF PRODUCING SILICON-CARBIDE SINGLE CRYSTALS BY SUBLIMATION RECRYSTALLIZATION PROCESS USING A SEED CRYSTAL

BACKGROUND OF THE INVENTION

1. Field of the Invention

The present invention relates to a method of producing silicon-carbide single crystals in which a hexagonal silicon-carbide single crystal of the 6H modification is grown by a sublimation recrystallization process.

2. Description of the Prior Art

Silicon carbide (SIC) is a semiconductor material having a wide forbidden energy band of 2.2 eV to 3.3 eV. Silicon carbide has excellent characteristics such that it is thermally, chemically and mechanically very stable and is also highly resistant to radiation damage. In contrast, a conventional semiconductor material, such as silicon, involves a problem that semiconductor elements formed from such a material are impracticable for use under severe conditions, such as high temperature, high output drive, and irradiation of radioactive rays, in particular.

Therefore, as a semiconductor element which can be used under such severe conditions as high temperature, high output drive, and irradiation of radioactive rays, a semiconductor element using silicon carbide is currently attracting attention, with much expectation placed thereon for use in a wide range of applications.

Unfortunately, however, there has not been established any such crystal growing technique as would permit stable supply of high-quality silicon carbide single crystals having a large area on an industrial scale. This has prevented practical application of silicon carbide despite the fact that silicon carbide, as a semiconductor material, has many advantages and good possibilities as above stated.

Hitherto, on a laboratory scale, silicon carbide single crystals of such a size as may just enable a semiconductor element to be formed have been produced by growing such a crystal by using a sublimation recrystallization technique.

However, this technique can only produce silicon carbide single crystals of a small area, and this makes it difficult to control the size and configuration of such a crystal to high precision. Further, it is not easy to control the resulting crystal structure of silicon carbide and the concentration of impurity carriers.

It is also known to employ a chemical vapor deposition technique (CVD process) to heteroepitaxially grow a crystal on a heterogeneous substrate of silicon or the like thereby to produce a silicon carbide single crystal of the cubic modification. According to this technique, it is possible to obtain a large-area silicon carbide single crystal. However, the technique has a limitation that the crystal grown involves about 20% of lattice misalignment relative to the substrate. As such, with the technique it is only possible to grow a silicon carbide single crystal including many lattice defects (of up to $10^7/cm^2$), it being not possible to obtain a high quality silicon carbide single crystal.

Therefore, in order to solve the above noted problems, an improved sublimation recrystallization method has been proposed wherein the process of sublimation recrystallization is carried out using a seed crystal (Yu. M. TAIROV and V. F. TSVETKOV "GENERAL PRINCIPLES OF GROWING LARGE-SIZE SINGLE CRYSTALS OF VARIOUS SILICON CARBIDE POLYTYPES", Journal of Crystal Growth, 52 (1981) 146–150).

The use of this process makes it possible to grow a silicon carbide single crystal while controlling the crystal structure and configuration thereof.

FIG. 4 shows generating rates of several crystal structures during a heating process of a silicon carbide crystal under normal pressure, with heating temperature taken as a parameter. Various crystal structures of hexagonal (6H and 4H modification) and rhombohedral (15R modification) crystal structure will be generated in mixture within the temperature range (2000° C. to 2500° C.) normally used in a sublimation recrystallization process (Philips Research Reports, 18 (1965), pp 161).

Usually, in a sublimation recrystallization method using a seed crystal, it is possible to grow a silicon carbide single crystal by controlling the temperature of the seed crystal, the temperature gradient between the seed crystal and the source material, and the pressure. During that process, generation of hexagonal crystal in modification of 6H and 4H (near 2000° C. in FIG. 9) can be controlled by the temperature, temperature gradient and pressure for crystal growth (Japanese Patent Laid-Open Publication No. 2-48495).

However, for the purpose of developing crystal of hexagonal system in modification of 6H without generating rhombohedral crystal in modification of 15R (near 2450° C. in FIG. 9), the process involves a problem that it is difficult to control crystal formation by such growth conditions as growth temperature, temperature gradient and growth pressure.

In particular, where a high-purity source material is used, or during the stage of growth through nitrogen addition for growing an n-type crystal, 6H and 15R crystal structure tend to grow in mixture. As such, it is not possible to selectively grow a 6H silicon carbide single crystal of the n-type alone.

SUMMARY OF THE INVENTION

Therefore, it is an object of the invention to provide a method of producing an n-type silicon carbide single crystal which can produce high-quality 6H silicon carbide single crystals of the n-type with good reproducibility.

In order to achieve the object of the invention, the invention provides a method of producing an n-type silicon carbide single crystal by a sublimation recrystallization method using a seed crystal, wherein crystal growth is carried out under nitrogen-containing atmosphere by using a source material comprising a high-purity silicon carbide powder which contains a slight amount of aluminum added thereto, or by using a source material comprising a silicon carbide powder and a slight amount of aluminum added thereto. During the process of crystal growth, the growth temperature, temperature gradient, and growth pressure are controlled to prevent growth of any crystal form other than 6H modification, such as 4H or 15R modification, so that a high quality 6H silicon carbide single crystal of the n type is grown.

As described above, a silicon carbide powder containing a slight amount of aluminum is used as source material so that by virtue of the aluminum impurity the generation of 15R-modification crystal forms is prevented under growth conditions that allow growth of a 6H- silicon carbide single crystal. Further, because of the fact that aluminum is a p-type impurity in relation to silicon carbide, nitrogen addition is effected in an amount more than compensating for an aluminum acceptor, whereby a 6H- silicon carbide single crystal of good-quality can be grown with good reproducibility.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Examples of the method of the present invention will now be described in detail with reference to the accompanying drawings.

(First Embodiment)

Figure 1:
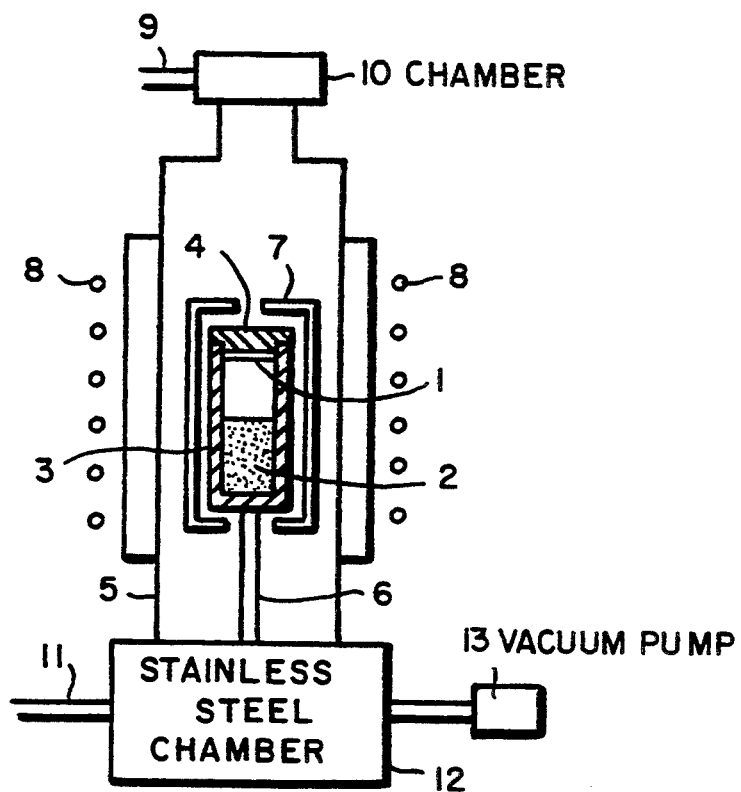
FIG. 1 is a schematic sectional view showing by way of example an apparatus for crystal growth employed in carrying out the method of producing n-type silicon carbide single crystal according to the invention.

FIG. 1 is a sectional view of a crystal growing apparatus used in carrying out the method of producing an n-type silicon carbide single crystal as exemplified by the present embodiment. The crystal growing apparatus is an apparatus for growing silicon carbide single crystal by a sublimation recrystallization technique using a seed crystal.

The process of growing a crystal by sublimation recrystallization process using a seed crystal is carried out by sublimating and recrystallizing a source material 2, namely an aluminum-containing silicon carbide powder on a silicon carbide single crystal substrate 1 used as a seed crystal. The silicon carbide single crystal substrate 1 is loaded into a graphite crucible 3. The graphite crucible 3 is mounted within a double quartz tube 5 through a graphite support rod 6.

A graphite felt 7 is placed around the graphite crucible 3 for thermoshielding purposes. A work coil 8 is wound about the outer periphery of the double quartz tube 5 so that a high frequency current is sent through the work coil 8 to heat the graphite crucible 3, whereby the raw material and seed crystal may be heated to respective desired temperatures.

At the top end of the double quartz tube 5 is mounted a stainless steel chamber 10 having a branch pipe 9 which serves as a gas inlet port. At the lower end of the double quartz tube 5 is provided a stainless steel chamber 12 having a branch pipe 11 which serves as a gas outlet port. A vacuum pump 13 is connected to the stainless steel chamber 12 so that the interior of the double quartz tube 5 can be evacuated to desired degree of vacuum.

The method of producing a 6H- silicon carbide single crystal of the n-type by employing a crystal growing apparatus of the above description will now be described in detail.

A 6H- silicon carbide single crystal substrate 101 having a growth orientation of silicon face <0001> which is used as a seed crystal is first mounted to the inner side of a cover 4 of the graphite crucible 3. A high-purity silicon carbide powder, as source material 2, and an aluminum powder are loaded into the graphite crucible 3.

For the silicon carbide powder, as the source material 2, such powder of the type corresponding to JIS particle size #250 and having an impurity content of less than 1 ppm is used. The proportion of aluminum powder relative to the silicon carbide powder is 50 ppm.

Nextly, the graphite crucible 3 filled with source material 2 is covered with the cover 4 to which is mounted the silicon carbide single crystal 1 as a seed crystal, and the crucible 3 is placed within the double quartz tube 5 through the graphite support rod 6. Further, the periphery of the graphite crucible 3 is covered with the graphite felt 7.

Subsequently, argon (Ar) gas and nitrogen gas (N$_2$) which is n-type impurity addition are introduced, as atmosphere gas, into the double quartz tube 5 through the branch pipe 9 of the stainless steel chamber 10. The flow rates of Ar gas and N$_2$ gas are set respectively at 1 liter/min. and 1 cc/min.

Then, a high-frequency current is caused to flow in the work coil 8, and the high-frequency current is regulated so that the temperature of the source material 2, i.e., silicon carbide powder and aluminum powder, can be controlled to 2300° C. and the temperature of the silicon carbide single crystal substrate 1, namely the seed crystal can be controlled to 2200° C.

Subsequently, the interior of the double quartz tube 5 is evacuated by the vacuum pump 13. Pressure reduction in this connection is carried out gradually from the atmospheric pressure to 30 torr over a time period of 20 minutes. Thereafter, the 30 torr condition is maintained for 5 hours.

Through the above described process is grown an n-type silicon carbide single crystal having a thickness of about 10 mm.

The n-type silicon carbide single crystal thus obtained was analyzed according to X-ray diffraction and Raman spectrometry. As a result, it was found that the n-type silicon carbide single crystal obtained was a hexagonal 6H- silicon carbide single crystal. This 6H silicon carbide single crystal of the n-type had a uniform crystal distribution over its entire structure of from the surface of the seed crystal, namely the silicon carbide single crystal substrate 1 to the outermost grown crystal surface, with little defect, if any, and had a specific resistance of 0.5 Ωcm, manifesting itself to be a high quality 6H- silicon carbide single crystal of the n-type.

The proportion of additional aluminum is 50 ppm in the above described embodiment, but for purposes of preventing the formation of crystal forms other than 6H, the proportion of additional aluminum may be within the range of 20 ppm to 100 ppm.

(Comparison example)

Crystal growth was carried out under the same conditions as those in the embodiments except that the source material powder contained no aluminum. The resulting product was examined as to its resistivity and crystal structure. It was found that while the product had a generally uniform resistivity of 0.3 Ωcm, 15R- and 6H- modification crystals were irregularly distributed.

Reasons why the proportion of additional aluminum is limited to the range of 20 ppm to 100 ppm is explained below.

Figure 2:
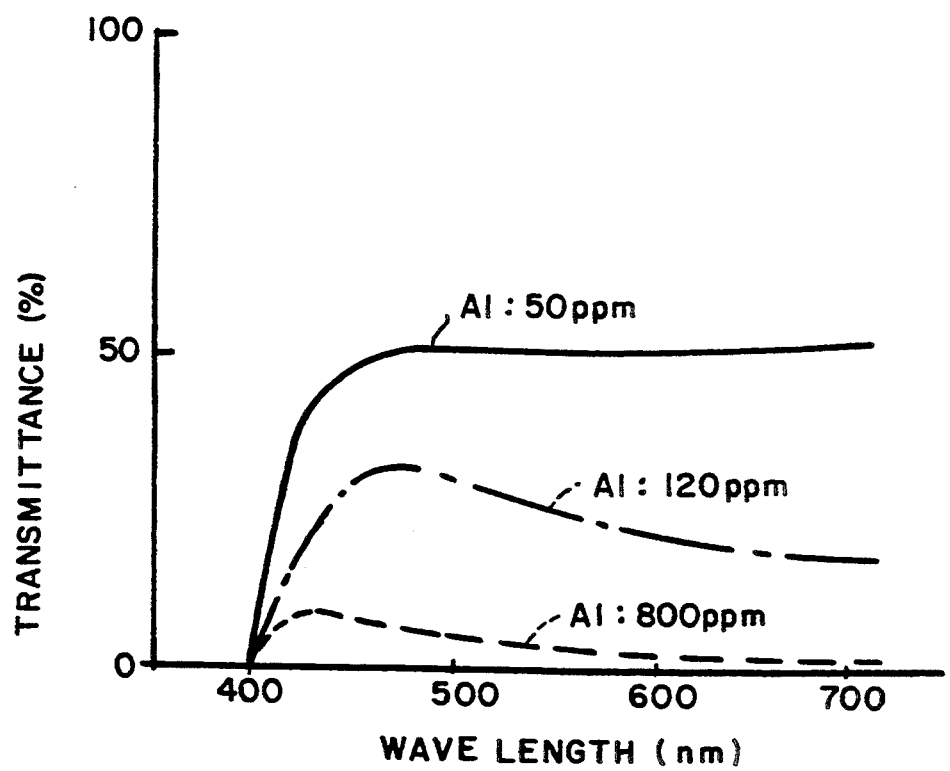
FIG. 2 is a graphical representation showing properties of transmittance of n-type silicon carbide single crystals produced according to the invention and those of similar single crystals produced in comparison examples.

If the amount of additional aluminum is more than 100 ppm, the transmittance property of the crystal is rendered unfavorable due to light absorption by aluminum, more especially, light absorption on the long wavelength side is increased, as shown by chain line (Al: 120 ppm) and broken line (Al: 800 ppm) in FIG. 2, in contrast to what is shown by solid line (Al: 50 ppm). When the former crystals (Al: 120, 800 ppm) are used in, for example, light-emitting elements, the problem is that the light-emitting elements, as a whole, become bluish.

Where the amount of additional aluminum is less than 100 ppm, with no nitrogen addition, a high-resistivity silicon carbide crystal grows on the seed crystal as well as n-type silicon carbide single crystal. Where the amount of aluminum addition is more than 100 ppm, with no nitrogen addition, p-type silicon carbide crystal tends to grow (for example, where Al: 150 ppm, p-type silicon carbide crystal with a carrier concentration of $1 \times 10^7$ cm$^{-3}$ is obtained).

Figure 3:
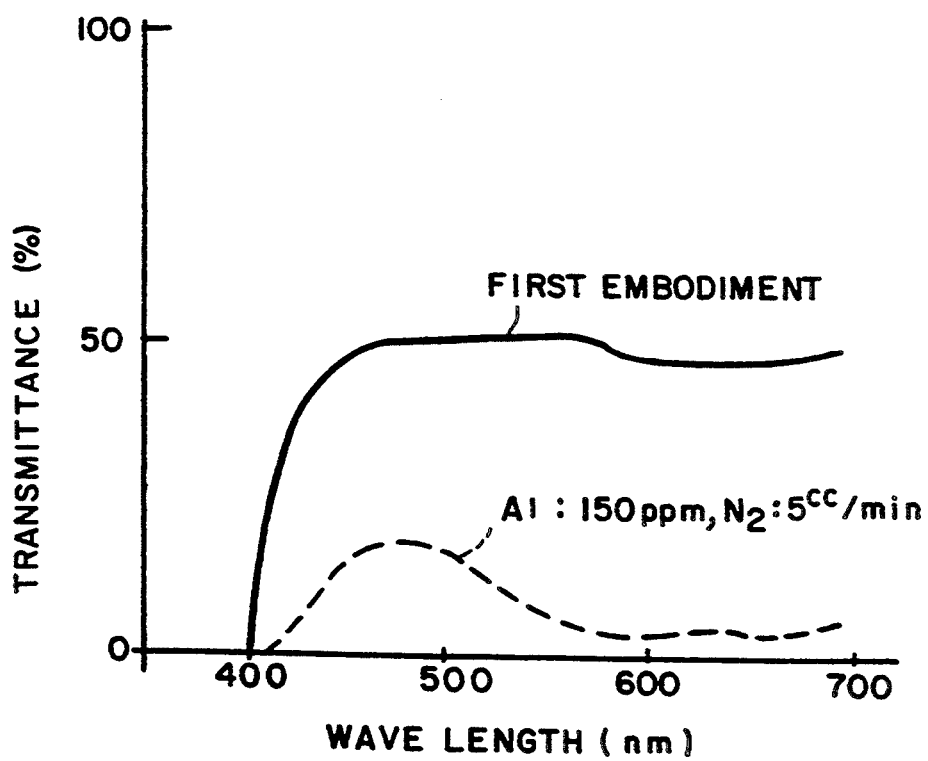
FIG. 3 is a graphical representation showing properties of transmittance of n-type silicon carbide single crystals produced in a first embodiment and those of similar single crystals produced in a comparison example.

In case that aluminum addition is more than 100 ppm, with a large amount of nitrogen added, and that the presence of aluminum acceptor is compensated for by nitrogen donor, n-type silicon carbide crystal growth is rendered unfavorable in respect of light transmission property due to light absorption by nitrogen and aluminum. Moreover, the presence of aluminum acceptor-nitrogen donor pairs in large number adversely affects crystallizability. In order to obtain an n-type silicon carbide single crystal in the case where aluminum addition is 150 ppm, for example, it is necessary that the flow rate of nitrogen gas in the first example must be increased to 5 cc/min., as against 1 cc/min. in that example. In that case, the carrier density and resistivity of the resulting silicon carbide crystal are $3 \times 10^7$ cm$^{-3}$ and 0.5 Ωcm respectively, which are of the same level as those in the first example; however, in respect of light transmission property, the case of 150 ppm aluminum addition (shown by broken line) is unfavorably compared to the first example, as shown by solid line in FIG. 3. An X-ray diffractometric examination with respect to crystallizability tells that the X-ray diffraction FWHM (Full width half maximum) in the case of 150 ppm Al addition, recorded at 150'', is far much inferior to that (30'') in the first example.

Figure 4:
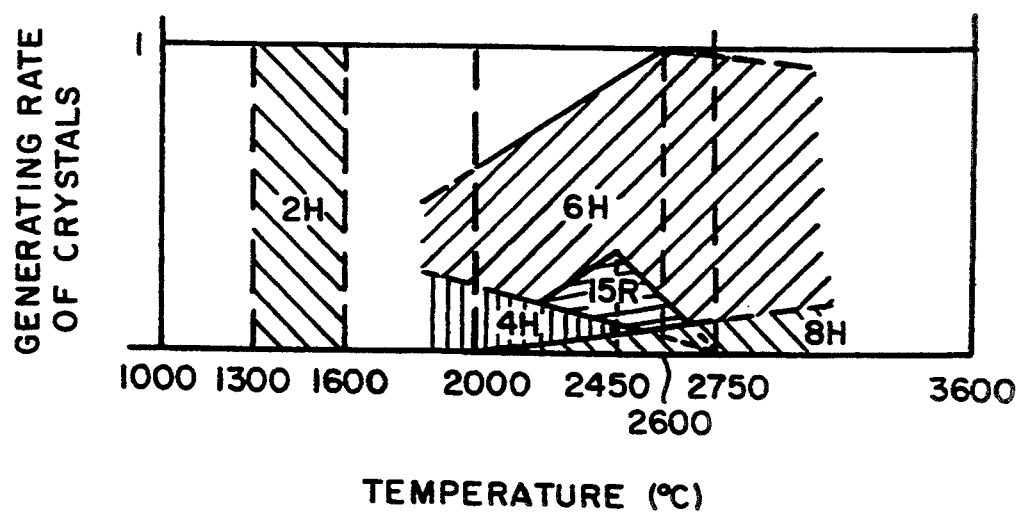
FIG. 4 is a diagram showing generating rates of several crystal structures during the heating process of a silicon carbide crystal under normal pressure.

On the other hand, when the amount of additional aluminum is less than 20 ppm, 6H- silicon carbide single crystal of the n-type can grow on the seed crystal. But 15R- silicon carbide crystal is generated in mixture with 6H- one due to the reduction rate of pressure, the temperature change and the like, because growth conditions of the 6H- silicon carbide single crystal are restricted narrowly as shown in FIG. 4. Where the amount of additional aluminum is 15 ppm in the above described embodiment, both 6H- and 15R- silicon carbide crystals grow in mixture. Because the growth of 15R- silicon carbide crystal is unavoidable with aluminum addition less than 20 ppm. When a little change of the growth conditions occurs with aluminum addition more than 20 ppm, the growth of 15R- silicon carbide crystal is avoidable due to the inhibitive effect of polymorphism by aluminium.

In the above described example of the invention, additional aluminum was aluminum metal powder; but the use of aluminum oxide or aluminum-silicon alloy can provide a similar effect.

(Second embodiment)

A high-purity silicon carbide powder having an impurity content of not more than 1 ppm and aluminum oxide powder, which constitute source material 2, are loaded into the graphite crucible 3. The silicon carbide powder of the source material 2 is of the type having a particle size corresponding to JIS #1000. The particle size of the aluminum oxide powder is not more than 1 μm.

The graphite crucible 3 filled with the source material 2 is closed with the cover 4 to which no seed crystal is mounted, the crucible 3 being placed within the double quartz tube 5 by means of the support rod 6. The outer periphery of the graphite crucible 3 is covered with a graphite felt 7.

Then, Ar gas, as an atmosphere gas, is introduced into the double quartz tube 5 through the branch pipe 9 of the stainless steel chamber 10. The flow rate of Ar gas is set at 1 liter/min.

Then, a high-frequency current is caused to flow in the work coil 8, and the high-frequency current is regulated so that the temperature of the source material 2, i.e., silicon carbide powder, and of the aluminum powder, can be controlled to 2000° C. to 2100° C., which temperature is maintained for 30 minutes.

Through this process, aluminum resulting from decomposition of the aluminum oxide reacts with the silicon carbide to form an aluminum-containing silicon carbide. In 10 this process, the amount of aluminum oxide and the treatment temperature are adjusted so that the proportion of aluminum in the aluminum-containing silicon carbide produced may be 30 ppm.

Nextly, a 6H- silicon carbide single crystal substrate having a growth orientation of silicon face <0001> which is used as a seed crystal is mounted to the inner surface of the cover 4 of the graphite crucible 3.

Then, the graphite crucible 3 which has been filled with source material 2, i.e., the aluminum-containing silicon carbide powder formed as above described, is covered with the cover 4 to which is mounted the silicon carbide single crystal substrate 1 which is a seed crystal, and the crucible 3 is placed within the double quartz tube 5 through the graphite support rod 6. Further, the periphery of the graphite crucible 3 is covered with the graphite felt 7.

Subsequently, Ar gas and N$_2$ gas for n-type impurity addition are introduced, as atmosphere gases, into the double quartz tube 5 through the branch pipe 9 of the stainless steel chamber 10. The flow rates of Ar gas and N$_2$ gas are set respectively at 1 liter/min. and 0.8 cc/min.

Then, a high-frequency current is caused to flow in the work coil 8, and the high-frequency current is regulated so that the temperature of the aluminum-containing silicon carbide powder, which is the source material 2, is controlled to 2250° C., and the temperature of the silicon carbide single crystal substrate 1, which is the seed crystal, is controlled to 2150° C.

Subsequently, the interior of the double quartz tube 5 is evacuated by the vacuum pump 13. Pressure reduction in this connection is carried out gradually from the atmospheric pressure to 45 torr over a time period of 60 minutes. Thereafter, the 45 torr condition is maintained for 6 hours.

Through this process, an n-type silicon carbide single crystal having a thickness of about 6 mm is grown.

The n-type silicon carbide single crystal thus obtained was analyzed according to X-ray diffractometry and Raman spectrometry. As a result, it was found that the n-type silicon carbide single crystal obtained was a hexagonal 6H- silicon carbide single crystal having a growth orientation of <0001>. This 6H- silicon carbide single crystal of the n-type was found to be a high quality single crystal of the kind, with a growth rate of 1 mm/hour, a specific resistance of 0.1 Ωcm, good light transmission property, and a uniform and defect-free crystal distribution.

The 6H- silicon carbide single crystals of the n-type formed in the above described first and second embodiments are well suited for use as a crystal growing substrate on which a silicon carbide single crystal can be grown by vapor phase epitaxy to provide a silicon carbide single crystal having excellent optical and electrical characteristics. Therefore, it is possible to use this 6H-form silicon carbide single crystal of the n-type to fabricate a bluelight-emitting element having good optical characteristics, as well as a silicon carbide-based semiconductor device (such as field-effect transistor, complementary MOS integrated circuit, or a variety of power elements) having good electrical characteristics.

Furthermore, the above described n-type, 6H- silicon carbide single crystal can be produced with good reproducibility through control of various conditions involved, such as growth temperature, temperature gradient, and growth pressure, and this provides for production of various types of silicon carbide-based semiconductor devices having good optical and electrical characteristics on an industrial scale and with good yield.

In the first and second embodiments, aluminum is added to a high-purity silicon carbide powder and the mixture is heat treated to prepare an aluminum-containing silicon carbide powder. Alternatively, aluminum may be added at the stage of silicon carbide powder preparation, and the resulting aluminum-containing silicon carbide powder may be used as such. In that case, where the proportion of aluminum in the resulting powder is 20 ppm to 100 ppm, the powder may be used as it is. However, if the proportion of aluminum is more than 100 ppm, the aluminum-containing silicon carbide powder should be mixed with a high-purity silicon carbide powder in suitable proportions.

In the first and second embodiments, aluminum oxide powder is added to the high-purity silicon carbide powder at the heat treating stage for preparation of the aluminum-containing silicon carbide powder; alternatively, aluminum metal, aluminum nitride, or aluminum-silicon alloy may be used instead of aluminum oxide powder.

Although high-purity silicon carbide powder is used in the above embodiments 6H- silicon carbide single crystal of the n-type may grow using high-purity silicon carbide with impurity more than 1 ppm except aluminum. However, when the impurity increases more than 1 ppm, defects in the crystal increase due to a formation of defect cores by the impurity. Moreover, a light transmission property of the grown crystal becomes unfavorable due to light absorption by the impurity.

(Comparison example)

Silicon carbide powder with 5 ppm impurity is used as the source material in the above embodiments. In this case, a lattice defect density of the obtained crystal is approximately $10^4/cm^2$, which is greater than that ($10^2/cm^2$) of the above embodiments. Also a light transmission property of the obtained crystal is inferior to that of the above embodiments by approximately 3%.

As may be clearly understood from the foregoing description, according to the method of producing a 6H- silicon carbide single crystal of an n-type of the invention, n-type silicon carbide single crystals can be grown with good reproducibility through a sublimation recrystallization method using a seed crystal, because a material comprising a silicon carbide powder which contains aluminum thereto in a proportion of 20 wt ppm to 100 wt ppm relative to the silicon carbide powder is used as source material, and sublimate this source material under an nitrogen-containing inert gas atmosphere, so that growth of 4H- or 15R- crystals under growth conditions for 6H-form silicon carbide single crystals can be effectively prevented by virtue of the aluminum content of the source material.

Therefore, the method of the invention enables production of high-quality n-type, 6H- silicon carbide single crystal with a high degree of reproducibility.

According to the method of producing an n-type silicon carbide single crystal of the invention, the aluminum in the source material is provided as one form of aluminum metal, aluminum oxide, aluminum nitride, and aluminum-silicon alloy. This provides for easy production of n-type, 6H- silicon carbide single crystals of high quality with a high degree of reproducibility.

According to the method of producing an n-type silicon carbide single crystal of the invention, as the silicon carbide powder in the source material is used a high-purity silicon carbide powder whose impurity content is not more than 1 wt ppm. This provides for easy production n-type, 6H- silicon carbide single crystals of higher quality with a high degree of reproducibility.

According to the method of producing a 6H- silicon carbide single crystal of an n-type of the invention, for the purpose of growing n-type silicon carbide single crystals with good reproducibility through the sublimation recrystallization method using a seed crystal, a silicon carbide powder containing 20 wt ppm to 100 wt ppm of aluminum is used as source material, and sublimate this source material under an nitrogen-containing inert gas atmosphere. Therefore, growth of 4H or 15R crystals under growth conditions for a 6H- silicon carbide single crystal can be effectively prevented by the aluminum. Therefore, according to the present invention, it is possible to produce a high quality n-type, 6H- silicon carbide single crystal with a high degree of reproducibility.

In the method of producing an n-type silicon carbide single crystal of the invention, the aluminum-containing silicon carbide powder as source material contains not more than 1 wt ppm of impurities other than aluminum. This enables production of higher quality n-type, 6H silicon carbide single crystals with a high degree of reproducibility.

In the method of producing an n-type silicon carbide single crystal of the invention, 6H- silicon carbide single crystal substrate having a silicon surface is used as the seed crystal. This prevents a growth of 4H crystal on the silicon surface, and makes it more easy to obtain 6H- silicon carbide single crystal.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of producing a 6H- silicon carbide single crystal of an n-type, comprising the step of:
   growing the n-type silicon carbide single crystal by a sublimation recrystallization method using a seed crystal and a source material, said source material being a silicon carbide powder which contains an aluminum thereto in a proportion of 20 weight ppm to 100 weight ppm relative to the silicon carbide powder, under an nitrogen-containing inert gas atmosphere.

2. A method of producing an n-type silicon carbide single crystal as set forth in claim 1, wherein:
   the aluminum in the source material is provided as one form of aluminum metal, aluminum oxide, aluminum nitride, and aluminum-silicon alloy.

3. A method of producing an n-type silicon carbide single crystal as set forth in claim 1, wherein:
   a silicon carbide powder constituent of the source material is a high purity silicon carbide powder whose impurity content is not more than 1 weight ppm.

4. A method of producing an n-type silicon carbide single crystal as set forth in claim 2, wherein:
   a silicon carbide powder constituent of the source material is a high purity silicon carbide powder whose impurity content is not more than 1 weight ppm.

5. A method of producing a 6H- silicon carbide single crystal of an n-type, comprising the step of:
   growing the n-type silicon carbide single crystal by a sublimation recrystallization method using a seed crystal and a source material, said source material being a silicon carbide powder containing 20 weight ppm to 100 weight ppm of aluminum, under an nitrogen-containing inert gas atmosphere.

6. A method of producing an n-type silicon carbide single crystal as set forth in claim 5, wherein:
   the aluminum-containing silicon carbide powder contains not more than 1 weight ppm of impurity other than the aluminum.

7. A method of producing an n-type silicon carbide single crystal as set forth in claim 1, wherein:
   6H- silicon carbide single crystal substrate having a silicon surface is used as the seed crystal.

* * * * *